United States Patent
Cantell et al.

(10) Patent No.: US 6,926,843 B2
(45) Date of Patent: Aug. 9, 2005

(54) ETCHING OF HARD MASKS

(75) Inventors: Marc W. Cantell, Sheldon, VT (US); Wesley Natzle, New Paltz, NY (US); Steven M. Ruegsegger, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 818 days.

(21) Appl. No.: 09/727,139

(22) Filed: Nov. 30, 2000

(65) Prior Publication Data

US 2002/0063110 A1 May 30, 2002

(51) Int. Cl.⁷ .............................................. H01L 21/00
(52) U.S. Cl. ............................. 216/51; 216/41; 216/74; 216/79; 438/706; 438/723
(58) Field of Search ............................. 216/41, 51, 74, 216/79; 438/706, 723, 587

(56) References Cited

U.S. PATENT DOCUMENTS

| | | | | |
|---|---|---|---|---|
| 5,282,925 A | * | 2/1994 | Jeng et al. ...................... 134/31 |
| 5,569,355 A | * | 10/1996 | Then et al. ..................... 216/24 |
| 5,585,012 A | * | 12/1996 | Wu et al. ....................... 134/1.1 |
| 5,685,951 A | | 11/1997 | Torek et al. ............... 156/646.1 |
| 5,762,755 A | * | 6/1998 | McNeilly et al. ............ 438/708 |
| 5,868,811 A | * | 2/1999 | Khan et al. ..................... 65/36 |
| 5,876,879 A | | 3/1999 | Kleinhenz et al. .............. 430/5 |
| 5,980,770 A | * | 11/1999 | Ramachandran et al. ...... 134/31 |
| 5,990,019 A | | 11/1999 | Torek et al. ................. 438/723 |
| 6,030,541 A | | 2/2000 | Adkisson et al. .............. 216/51 |
| 6,211,044 B1 | * | 4/2001 | Xiang et al. ................. 438/585 |
| 6,235,627 B1 | * | 5/2001 | Nakajima .................... 438/638 |

* cited by examiner

*Primary Examiner*—Shamim Ahmed
(74) *Attorney, Agent, or Firm*—Connolly, Bove, Lodge & Hutz, LLP; William D. Sabo

(57) ABSTRACT

Lines are fabricated by patterning a hard mask to provide a line segment, the line segment having a first dimension measured across the line segment; reacting a surface layer of the line segment to form a layer of a reaction product on a remaining portion of the line segment; and removing the reaction product without attacking the remaining portion of the line segment and without attacking the substrate to form the line segment with a dimension across the line segment that is smaller than the first dimension.

20 Claims, 5 Drawing Sheets

ETCHING OF HARD MASKS

FIELD OF THE INVENTION

The present invention relates to building lines comprising the etching of hard masks to achieve greater sub-lithographic dimensions. The present invention is especially advantageous for generating and controlling sub-lithographic gate in Field Effect Transistors (FETs). More particularly, the present invention provides a method whereby the degree of etching can be readily adjusted and therefore used in a feedforward control loop to compensate for photo-lithography or hard-mask process deviations before the gate electrode is defined.

BACKGROUND OF THE INVENTION

Microelectronic devices used in fabricating integrated circuits are manufactured by employing photolithographic techniques. Fabricating various structures, particularly electronic device structures, typically involves depositing at least one layer of a photosensitive material, generally known as a photoresist material on a substrate. The photoresist material may then be patterned by exposing it to radiation of a certain wavelength to alter characteristics of the photoresist material. In many instances, the radiation is from ultraviolet range of wavelengths causing desired photochemical reactions to occur within the photoresist. The photochemical reactions typically change the solubility characteristics of the photoresist, thereby permitting removal of certain selected portions of the photoresist while maintaining the other portions of the substrate. The selective removal of certain parts of the photoresist allows for protection of certain areas of the substrate while exposing other areas. The portions of the photoresist that remain on the substrate are used as a mask or stencil for processing the underlying substrate.

As methods for producing miniature electronic structures improve, the desire to produce even smaller structures has continued to increase. For instance, the reduction of the FET dimensions has been the primary vehicle pursued to meet the insatiable consumer need for faster electronics. A first-order correlation to faster FET is smaller gate width dimension, and therefore it is called the Critical Dimension (CD). FIG. 1 shows a simple cross-sectional schematic of a FET. There is a thin dielectric 5 between a substrate 1 and a gate electrode 4. A source 2 and drain 3 are doped regions to the sides of the gate. The width of the gate is the CD 6. It is generally known to those skilled in the art that as the CD gets smaller, the FET gets faster.

The dimension of most key features in microelectronics is limited by the dimension of the resist that is printed in a photolithography step. Therefore, the primary focus for producing smaller CDs has been upon improved photolithography. FIGS. 2a–2d shows the most common manufacturing process used to create a FET. A stock of films is deposited upon the wafer or substrate 110 as illustrated in FIG. 2a. First a thin dielectric 112, usually a thermal oxide (Tox) is grown on the substrate 110. Then the gate material 114 is deposited, which is usually a polysilicon. Then a photoresist 116 is spun on. FIG. 2b shows the lithography process. The photoresist 116 is exposed to light energy through a mask, and when washed with a developer, the desired pattern 122 remains. This pattern exposes the layer underneath to the gate electrode etch process as shown in FIG. 2c. Usually, this etch process is a RIE (Reactive Ion Etching). It removes exposed layer, yet keeps the features under the photoresist mask. Finally, the photoresist is removed and only the desired gate electrode remains. The width of the photoresist 122 was transferred directly to the gate 114, minus the etch-bias 118 from the RIE. The etch-bias is the difference between the initial photoresist (PR) CD 122 and the final gate CD 142. See FIG. 2d.

Different etching processes and compositions can produce more or less etch-bias. A larger etch-bias produces smaller gate CDs. However, there is typically a cost associated with this desired result. Some compositions will produce large N-I (nested to isolated linewidth) offset deltas when the etch-bias is too high. Other compositions will produce undesireable sidewall profiles. A major problem of the RIE aggressively going after a large etch-bias is the complete removal of the photoresist mask during the etch. This results in "opens" or removal of the polysilicon gate feature completely in a localized or general area.

Another method for defining gate electrodes is with a hard mask process. FIGS. 3a–3d show that this method simply inserts a thin material 230 usually a dielectric, between the photoresist and gate, and this requires an extra etch step. Hard-mask gate definition is often used to enhance polysilicon gate profile and decrease aspect ratio so that removing bottom corner of gate material is easier. However, the same problems described above for soft-mask (PR) exist for hard-mask when etch-bias is aggressively pursued in order to achieve sub-lithographic features.

One particular current technique for achieving sub-lithographic gate CD involves a separate photoresist trimming step. Here the "as printed" resist is consumed by an oxygen plasma prior to RIE etching. However, there is a limit to how much the resist can be trimmed and the resist retain acceptable profiles. Projected demands for smaller linewidths cannot be met by current photo and RIE trim capabilities.

As the demand for smaller CDs continues, there is a need for new methodologies to produce smaller CDs. Achieving smaller photoresist CDs has proved very difficult as the current technology is at the end of the UV spectrum. Other methods for producing sub-lithographic features are desired. Bearing in mind these demands and deficiencies of the prior art, it would therefore be desirable to provide an improved method of forming a semiconductor device.

SUMMARY OF THE INVENTION

The present invention makes possible a method for producing sub-lithographic gate electrode widths. The method of the present invention can be carried out without any detriment to N-I offset or opens, as is typical of other methods. The present invention can be used in a feedforward control loop where the actual etch-bias is a function of a priori hard-mask width measurement.

More particularly, the present invention relates to a method of fabricating a line which comprises:

a) providing a substrate having a hard mask material on the substrate;

b) patterning the hard mask material to provide a line segment, the line segment having a first dimension measured across the line segment;

c) reacting a surface layer of the line segment to form a layer of a reaction product on a remaining portion of the line segment;

d) removing the reaction product without attacking the remaining portion of the line segment and without attacking the substrate to form the line segment with a dimension across the line segment that is smaller than the first dimension.

BRIEF DESCRIPTION OF THE DRAWINGS

The features of the invention believed to be novel and the elements characteristic of the invention are set forth particularly in the appended claims. The figures are for illustrative purposes only and are not drawn to scale. The invention itself, however, both as to organization and method of operation, may be understood by reference to the detailed description which follows taken in conjunction with the accompanying drawings in which:

BEST AND VARIOUS MODES FOR CARRYING OUT INVENTION

Figure 1:
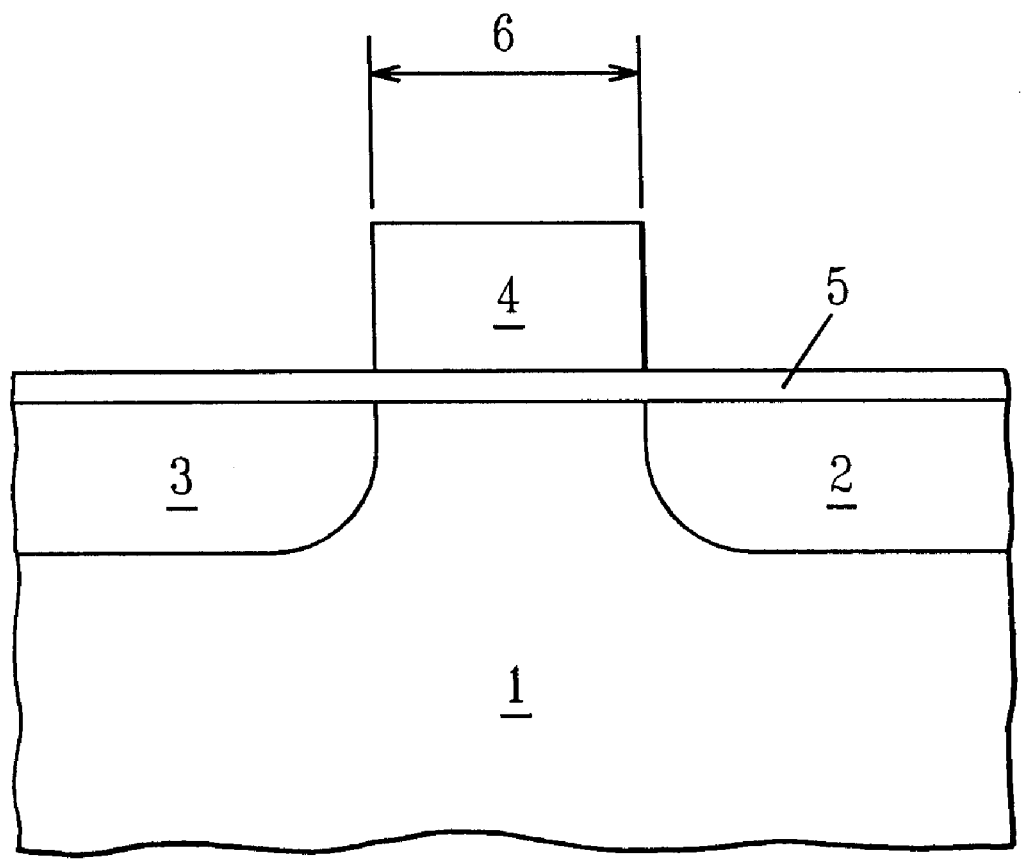
FIG. 1 is an illustrative schematic of a simple FET cross-sectional view as disclosed in the prior art.
Figure 2A:
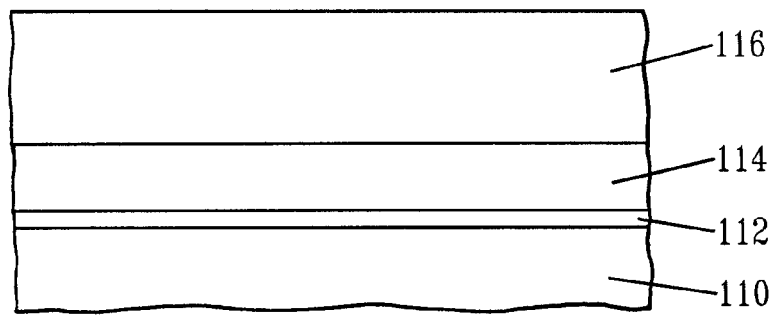
FIGS. 2a–2d represent a process flow illustrating typical prior art for soft-mask gate electrode definition.
Figure 2B:
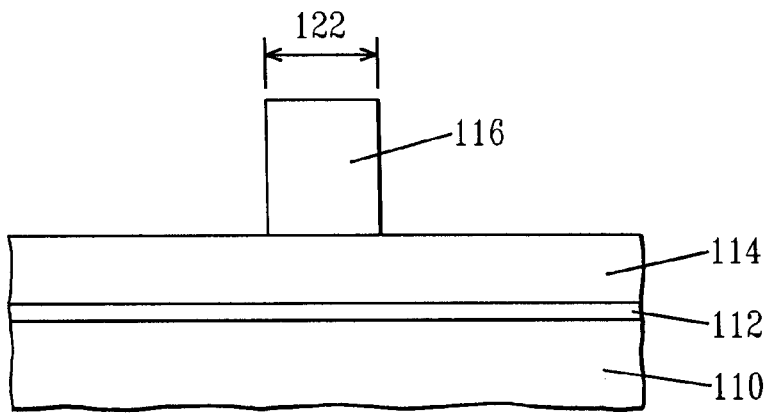
Figure 2C:
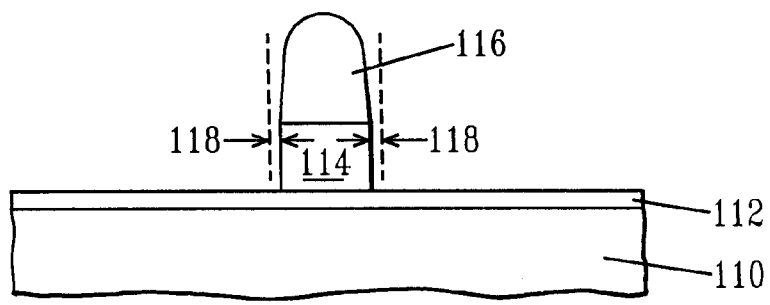
Figure 2D:
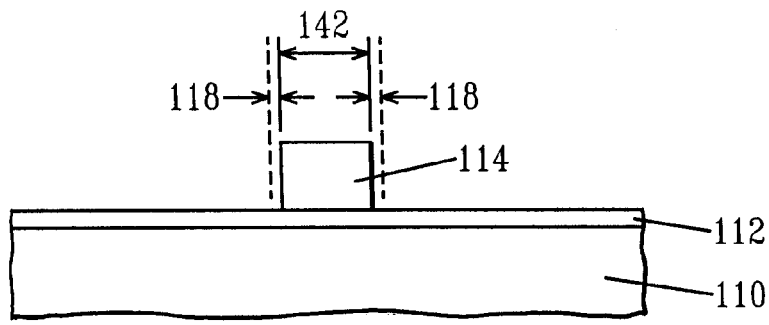
Figure 3A:
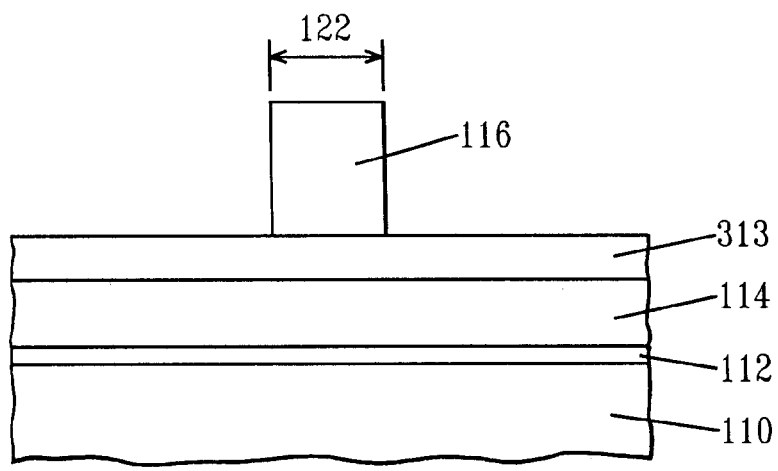
FIGS. 3a–3d represent a process flow illustrating typical prior art for hard-mask gate electrode definition.
Figure 3B:
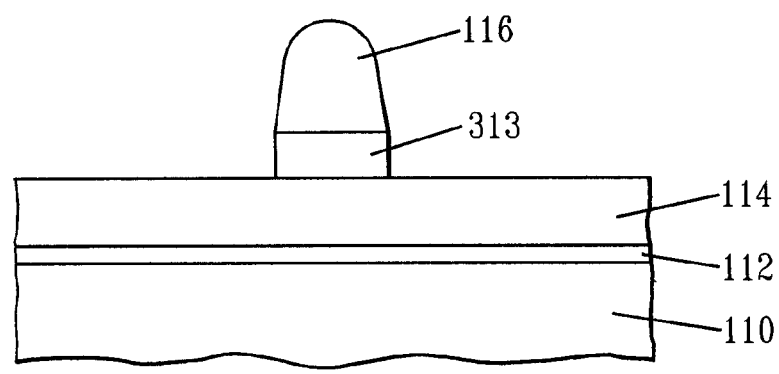
Figure 3C:
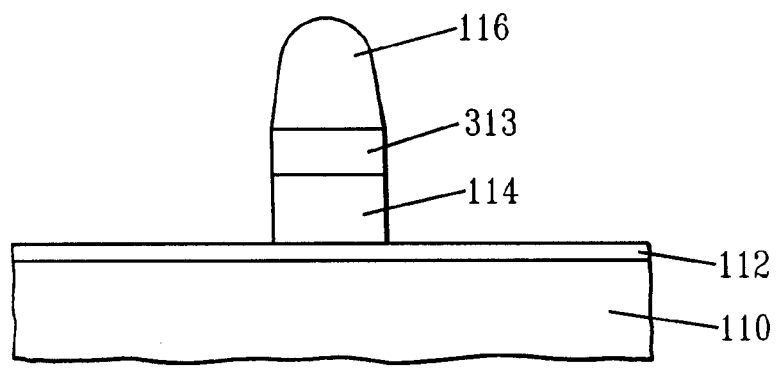
Figure 3D:
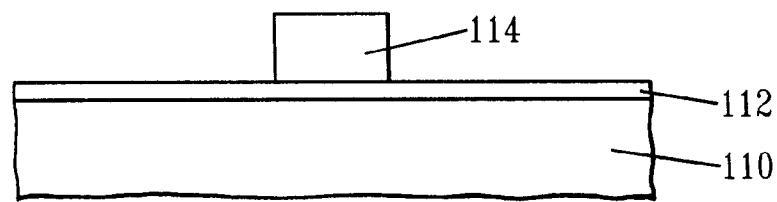

In order to facilitate an understanding of the present invention, reference will be made to the figures in which like numerals refer to like features of the invention. Features of the invention are not necessarily drawn to scale in the drawings.

The present invention overcomes the prior art by providing a new method for obtaining reduced CD widths using present photo-lithography and RIE etch with little or no detriment to N-I offset. The present invention also overcomes the prior art by providing very reproducible and controllable CD definition process that can be used in a feedforward control loop to compensate for measured photoresist or hard-mask definition process steps.

Figure 4A:
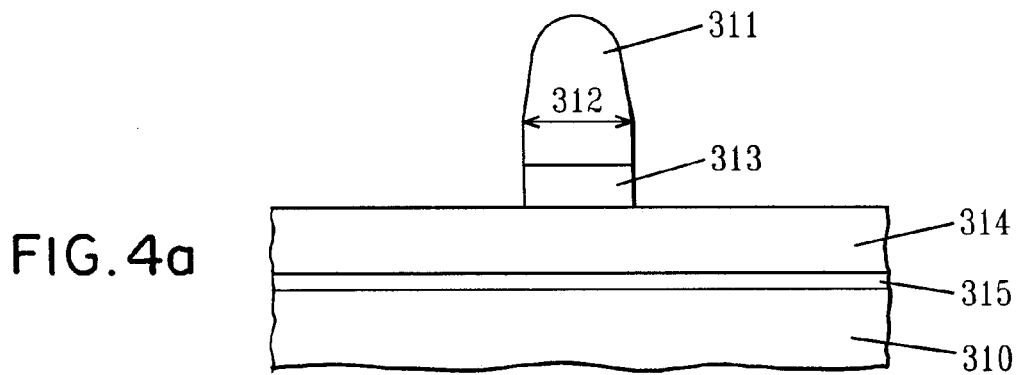
FIGS. 4a–4d represent a process flow illustrating a preferred embodiment of this invention: hard-mask definition.
Figure 4B:
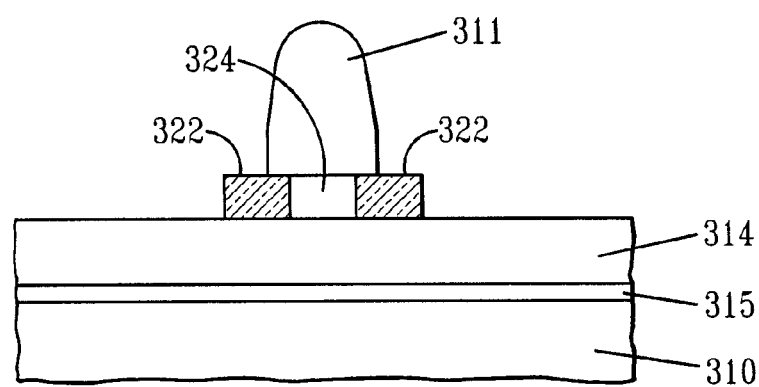
Figure 4C:
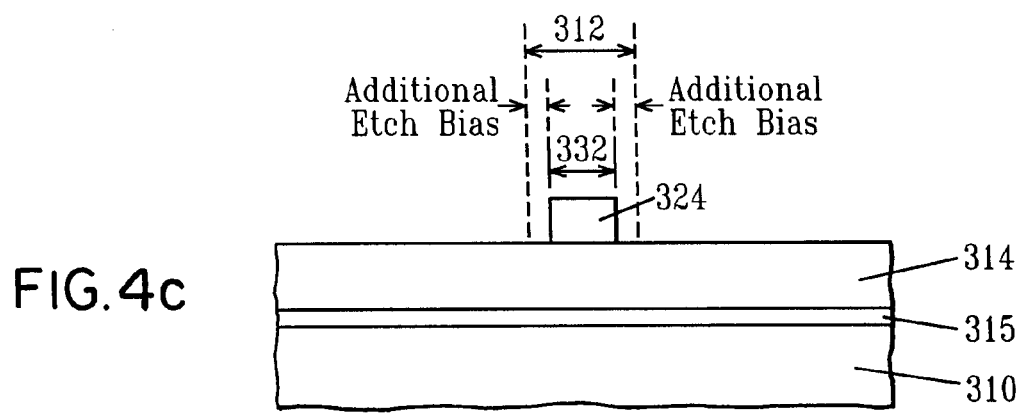

The present invention provides an improved method for achieving sub-lithographic gate electrode widths, and is illustrated in FIGS. 4a–4d. An intermediate etch step (see FIG. 4b) after the hard-mask definition (se FIG. 4a) and before the polysilicon gate etch (see FIG. 4c) is inserted into the typical hard mask gate definition process of FIGS. 3a–3d. This intermediate etch step (FIG. 4b) includes reacting a surface layer of an etch line segment of the hard mask 313 to form a layer of a reaction product 322 on the sidewalls of the line segment, followed by removing the reaction product without attacking the remaining portion of the line segment and without attacking the substrate, to form the line segment with a dimension across the line segment 332 as illustrated in FIG. 4c that is smaller than the initial dimension of the etched hard mask 312. This step provides additional etch-bias, i.e. it further shrinks the CD below what photo-lithography can print; however, it does so without increasing N-I offset or affecting polysilicon profile as is typical of increasing etch-bias or adding PR or ARC trim steps with current RIE processes.

The preferred method to carry out this step is a vapor phase etch (VPE) step in FIG. 4b. Successfully employing a VPE for the purposes of the present invention was quite unpredictable and not even remotely suggested by using similar techniques for removing native oxide over a horizontal surface. It has been found according to the present invention, that the VPE is an isotropic, self-limiting etch. That is, it etches in all directions (isotropic) and the etching mechanism stops after a certain amount of material has been etched (self-limiting). These two features are utilized according to the present invention to shrink the CD of the hard-mask uniformly, repeatedly, and without N-I (nested to isolated linewidth) offset.

The preferred VPE employed in the present invention comprise HF and $NH_3$ in a preferred ratio of about 2:1. The process can be carried in a slightly modified standard AMAT 5000 single wafer etch chamber. The chamber pressure employed is typically about 3 to about 50 mtorr; and more typically about 5–10 mtorr. The pressure is sufficiently low that loading effects within a chip are non-existent. Higher pressure processes, or plasma/RIE processes can show loading effects from localized depletion of reactants from substrate charging differences, or from electron emission differences. The present invention does not show these effects because it does not use a plasma and it operates at a low pressure.

The temperature of the wafer during the VPE is typically about 10° C. to about 35° C., a particular example being normal room temperature. The temperature of the wafer can be used to tailor the amount of reaction product deposited on the wafer. The higher the temperature with respect to ambient (the chamber walls), the lower the amount of reaction product that deposits or condenses on the wafer.

The gasses are not mixed in a manifold, but introduced into a chamber separately. The top end-point port of the chamber was converted to the entrance of the HF. The VPE process is a two step process. During this first step of VPE, the reaction step, a solid-byproduct (ammonium bifluoride) 322 (FIG. 4b) is formed on the exposed surfaces of the hard-mask. In the second step of VPE, the desorb step, the ammonia bifluoride byproduct is removed.

The preferred methods of removing the ammonia bifluoride byproduct are heating the wafers above 100° C. or employing a water rinse such as deionized water. FIGS. 4a–4d show a flow diagram of a preferred embodiment process flow. The silicon dioxide or other hard-mask material 313 on polysilicon layer 314 located on gate oxide layer 315 which in turn is located on substrate 310 is defined. A photoresist 311 is optionally present on oxide hard-mask 313. The wafer then enters the VPE process. First, the wafer is put into the VPE reaction chamber and the HF and $NH_3$ react with the exposed sidewalls of the hard-mark. The reaction consumes the hard-mask isotropically and creates the solid ammonia byfluoride byproduct 322 (see FIG. 4b) on the exposed hard-mask surfaces. As this byproduct gets thicker, the reaction slows down and it eventually terminates at thicknesses on the order of 200–400 Angstroms. This causes the self-limiting property of the etch, which allows the nested and isolated lines to achieve the same amount of oxide removal resulting in no offset. It also produces a very uniform and repeatable etch. The self-limiting reaction means variations in the amount of hard mask trimming should be minimized within a wafer, from wafer to wafer, from tool to tool and from one product part to another.

Figure 4D:
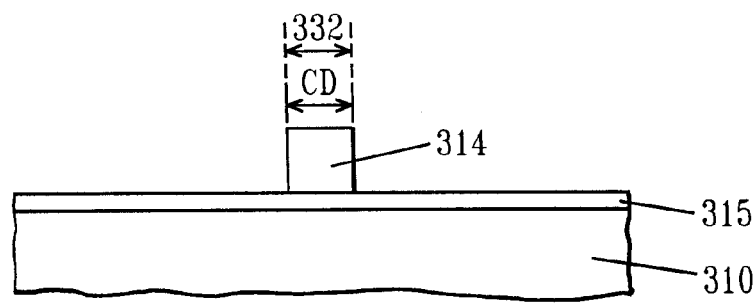

The wafer is then removed from this chamber and sent to the second desorb step. This can be done in either a RTP (Rapid Thermal Process) chamber to be heated typically to about 100° C. or above and more typically about 100° C. to about 200° C., or a water bath to be rinsed. This removes the solid byproduct 322 resulting in hard-mask features that are narrower. See FIG. 4c. Typically, additional etchbiases from this VPE etch are on the order of about 10 to about 40 nanometers (i.e. about 5 to about 20 nanometer of horizontal etching on each side of the hard-mask) and preferably about 20 to about 30 nanometers. The normal width of the hard-mask prior to the etch bias is about 80 to about 200 nanometers and more typically about 100 to about 150 nanometers. The hard mask is typically about 500 to about 1000 angstroms thick. The hard mask is then used as a mask to define the gate 314 as illustrated in FIG. 4d.

The photoresist can be stripped off at various times during the process: either before the VPE etch, during the VPE desorb step, or after. The optimal place may depend upon the integration strategy. When the photoresist is left remaining during the VPE, only the exposed sidewalls will etch and therefore the hard-mask will only be reduced in width and not in thickness. This will eliminate the problematic issue of etching through the mask and into the desired underlying features.

Figure 5:
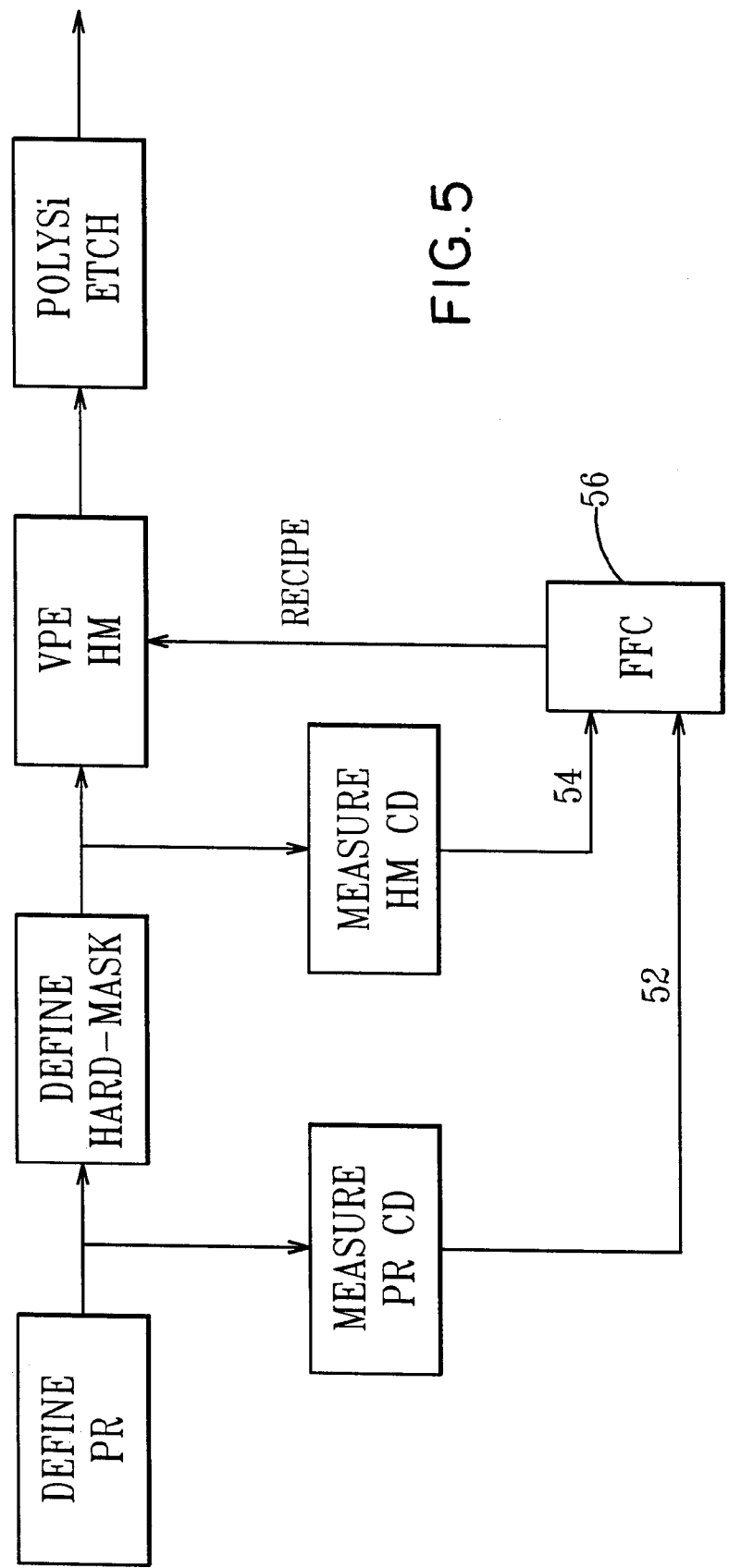
FIG. 5 is a system schematic illustrating a preferred embodiment of feedforward implementation for this invention.

Since the VPE process is highly repeatable, it can be used in a feedforward control loop in order to reduce CD variation as shown in FIG. 5. The measurement 52 of the photoresist mask width and measurement 54 of the hard-mask width (if photoresist is removed), can be fed-forward to a feedforward controller (FFC) 56 before the VPE etch. Based on this measurement, a VPE recipe can be selected such that the etch-bias of the recipe compensates for any measured or perceived hard-mask CD deviation, and therefore, the resulting polysilicon gate CD is closer to target. This type of feedforward control has been described in Ruegsegger, S. M. *Feedforward Control for Reduced Run-to-Run Variation in Microelectronic Manufacturing*, PhD thesis, The University of Michigan, 1998, disclosure of which is incorporated herein by reference.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of fabricating a line comprising:
    a) providing a substrate having a hard mask material on the substrate;
    b) patterning the hard mask material to provide a line segment, the line segment having a first dimension measured across the line segment;
    c) reacting a surface layer of the line segment by vapor phase etching to form a layer of reaction product on sidewalls of the line segment;
    d) removing the reaction product without attacking the remaining portion of the line segment and without attacking the substrate to form the line segment with a dimension across the line segment that is smaller than the first dimension.

2. The method of claim 1, wherein the first dimension is a minimum dimension achievable with a photolithographic process.

3. The method of claim 1, wherein the line segment after (d) is a sub-lithographic dimension.

4. The method of claim 1, wherein the hard mask is silicon dioxide.

5. The method of claim 1, wherein the reacting by said vapor phase etching comprises HF and $NH_3$.

6. The method of claim 5 which comprises removing the reaction product by heating or by dissolving in a solvent comprising water.

7. The method of claim 1 which further comprises measuring the width of the hard mask and controlling the reacting by basing the reacting on the measuring to form a layer of reaction product of a desired thickness resulting in a final hard mask width or CD of a desired value.

8. The method of claim 1 wherein the patterning comprises providing a plurality of lines of approximate line widths.

9. The method of claim 1 wherein said line segment is about 10 to about 40 nanometers smaller than said first dimension.

10. The method of claim 1 wherein said line segment is about 20 to 30 nanometers smaller than said first dimension.

11. The method of claim 1 which comprises removing the reaction product by heating to a temperature of about 100° C. or above.

12. The method of claim 1 wherein the reacting by said vapor phase etching comprises HF and $NH_3$ at a ratio of about 2:1.

13. The method of claim 12 wherein the reacting is carried out under pressure of about 3 to about 50 mtorr and a temperature of about 10 to about 35° C.

14. The method of claim 1 which comprises removing the reaction product by heating to a temperature of about 100° C. to about 200° C.

15. The method of claim 5 which comprises removing the reaction product by dissolving in a solvent comprising water.

16. The method of claim 1 which further comprises providing a photoresist on the hard mask and removing it subsequent to the reacting.

17. The method of claim 1 wherein the vapor phase etching is carried out at temperatures of about 10° C. to about 35° C.

18. The method of claim 1 wherein the vapor phase etching is carried out at about normal room temperatures.

19. The method of claim 5 wherein the vapor phase etching is carried out at temperatures of about 10° C. to about 35° C.

20. The method of claim 5 wherein the vapor phase etching is carried out at about normal room temperature.

* * * * *